United States Patent
Johnson

(10) Patent No.: US 7,455,915 B2
(45) Date of Patent: Nov. 25, 2008

(54) SELECTIVE APPLICATION OF CONDUCTIVE MATERIAL TO SUBSTRATES BY PICK AND PLACE OF COMPLIANT CONTACT ARRAYS

(76) Inventor: Morgan T. Johnson, 2370 SW. Cedar, Portland, OR (US) 97205

( * ) Notice: Subject to any disclaimer, the term of this patent is extended or adjusted under 35 U.S.C. 154(b) by 0 days.

(21) Appl. No.: 11/349,285

(22) Filed: Feb. 6, 2006

(65) Prior Publication Data

US 2006/0128176 A1   Jun. 15, 2006

Related U.S. Application Data

(63) Continuation-in-part of application No. 10/917,029, filed on Aug. 11, 2004, now Pat. No. 6,994,918.

(60) Provisional application No. 60/494,710, filed on Aug. 12, 2003.

(51) Int. Cl.
  *B32B 15/00*   (2006.01)
  *H05K 7/10*   (2006.01)

(52) U.S. Cl. .................. 428/618; 257/779; 257/786; 361/751; 361/771; 361/808; 439/66

(58) Field of Classification Search .............. 439/59, 439/63, 66; 257/779, 781, 786; 428/615–618; 361/751, 771, 808
See application file for complete search history.

(56) References Cited

U.S. PATENT DOCUMENTS

| | | | | |
|---|---|---|---|---|
| 3,781,596 A | * | 12/1973 | Galli et al. | 361/751 |
| 5,703,331 A | * | 12/1997 | Brodsky et al. | 174/254 |
| 5,793,117 A | * | 8/1998 | Shimada et al. | 257/780 |
| 6,066,808 A | * | 5/2000 | Kresge et al. | 174/262 |
| 6,841,882 B2 | * | 1/2005 | Chien | 257/777 |
| 6,854,985 B1 | * | 2/2005 | Weiss | 439/91 |
| 7,045,901 B2 | * | 5/2006 | Lin et al. | 257/778 |

* cited by examiner

*Primary Examiner*—Cathy F. Lam
(74) *Attorney, Agent, or Firm*—Werner & Axenfeld, PC

(57) ABSTRACT

Application of a conductive material with a compliant underlayer onto selected pads of a substrate, includes forming at least one padstack, by patterning a sheet including a stack of material layers. Padstacks may include a first conductive top layer, one or more underlying layers, and a bottom attachment layer, such as a solder layer. At least one flexible, or compliant, layer is disposed in the sheet between the top and attachment layers. The compliant layer may be a conductive elastomer. The top layer of the padstacks are adhered to a soluble tape, and this composite structure is moved into place over the circuit board by means of a pick and place operation. The placement of the padstacks is followed by a solder reflow to adhere the padstacks to the contact pads of the substrate, and by a wash cycle with a solvent to remove the soluble tape.

14 Claims, 8 Drawing Sheets

202 Au
204 Ni
206 copper
208 solder

SELECTIVE APPLICATION OF CONDUCTIVE MATERIAL TO SUBSTRATES BY PICK AND PLACE OF COMPLIANT CONTACT ARRAYS

RELATED APPLICATIONS

This is a continuation-in-part of earlier filed non-provisional application Ser. No. 10/917,029, filed 11 Aug. 2004, now U.S. Pat. No. 6,994,918 entitled "Selective Application of Conductive Material To Circuit Boards By Pick And Place", which claimed the benefit of provisional application 60/494,710, filed 12 Aug. 2003.

FIELD OF THE INVENTION

The present invention relates generally to electronic product manufacturing, and more particularly relates to the application of conductive material to selected areas of a circuit substrate, such as a board, typically by pick and place operations.

BACKGROUND

Many electronic products are provided in the form of a plurality of components, such as, electrical circuit elements and/or integrated circuits, mounted upon an underlying substrate, wherein that substrate provides various conductive paths between two or more of the mounted components, and/or between at least one of the mounted components and an external connection terminal. One well known form of substrate for mounting components and for providing the aforementioned conductive paths is the printed circuit board.

Printed circuit board manufacturing generally involves the formation of a plurality of conductive traces disposed on at least one major surface of a generally planar, generally rigid, insulating material. Many insulating materials have been used to form substrates for electronic products, such as, but not limited to, FR4, epoxy, and ceramics. Printed circuit boards may have conductive traces disposed on each of two opposing sides thereof. Similarly, printed circuit boards may have one or more layers of conductive traces disposed within the insulating material. Printed circuit boards may have holes, or openings, therethrough for the mounting of components, mechanical alignment of the printed circuit board to another unit, or plated through holes for the interconnection of the various layers of conductive traces.

A substrate similar to the printed circuit board, but which is not generally rigid, is referred to herein as a flex substrate. Such flex materials with patterned conductive traces are well known in the electronic arts and have been used for a variety of applications including backplane connector cables, and for providing a base upon which components may be attached.

A common manufacturing process for forming conductive traces on printed circuit boards, includes forming a blanket layer of conductive material and then etching away certain portions so as to form spaces between the remaining conductive material which, subsequent to this etching operation, is in the form of conductive traces. A commonly used conductive material for such applications is copper.

In certain circumstances, conductive material with chemical and electrical properties different from those of copper are required. One conductive material that is used in such circumstances is gold. Gold has a lower electrical resistivity than copper, and this lower electrical resistivity provides for improved electrical performance in many types of electrical circuits. Additionally, gold, as compared to copper, has the desirable property of being less reactive to atmospheric gases, and hence is less likely to corrode.

Those skilled in the electronic arts in general, and in circuit board design and manufacturing, and integrated circuit packaging, in particular, will recognize that although gold has certain desirable electrical and chemical properties, it is an expensive element to include in a product or in a manufacturing process. In addition to being expensive, some manufacturing processes for applying gold require a wet chemical environment.

What is needed are methods and apparatus that are convenient and cost-effective for applying gold to portions of substrates, such as, circuit boards and integrated circuit packages.

SUMMARY OF THE INVENTION

Briefly, application of a conductive material, which itself is disposed over a compliant underlayer, onto selected pads of a circuit board, includes forming one or more conductive pad structures, or padstacks, by patterning a sheet that includes a stack of material layers. Such conductive pad structures may include a first conductive top layer, one or more underlying layers, and a bottom attachment layer, such as, a solder layer. At least one flexible, or compliant, layer is disposed in the sheet between the top layer and the attachment layer. Such a compliant layer may be, for example, a conductive elastomer. The top layer of one or more padstacks are adhered to a soluble tape, and this composite structure is moved into place over a selected region of a substrate, typically by means of a pick-and-place operation.

In a further aspect of the present invention, the placement of a composite structure having an attachment layer comprising solder is followed by a solder reflow operation by which the padstacks are adhered to contact pads of the substrate.

In a still further aspect of the present invention, a wash with a solvent suitable to remove the soluble tape is performed.

DETAILED DESCRIPTION

Various embodiments of the present invention provide a new class of component for use in manufacturing electronic products including printed circuit boards, flex substrates, or integrated circuit packaging. More particularly, various embodiments of the present invention provide pick and place operations to provide a first material overlay disposed over a second material base layer, and having a compliant layer disposed therebetween.

In typical embodiments of the present invention, a first electrically conductive material is disposed over a second electrically conductive material and attached thereto. Although typical embodiments involve electrically conductive materials, it is noted that an electrically insulating material could also be disposed over and attached to an underlying material which itself is disposed on a circuit board.

Specific embodiments of the present invention provide for putting gold on pads of printed circuit boards, away from the edges of such printed circuit boards. Such selective application of gold by pick and place operations followed by a solder reflow, and wash cycle, provide for convenient and cost-effective creation of gold-plated contact pads on circuit boards.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Reference herein to "circuit boards", unless otherwise noted, is intended to include any type of substrate upon which a material may be selectively placed. For example, such substrates may be rigid or flexible, ceramic, flex, epoxy, FR4, or any other suitable material.

As noted above, some electrical or electronic products require a highly conductive material, such as gold, to be put on the pads of printed circuit boards. Conventionally, putting gold on pads of printed circuit boards that are located away from the edges of those boards can add 15% to 20% to the cost of each such board. Gold pads are often required for non-soldered, pressure connect mounting of land grid array (LGA) packages into sockets.

In one aspect of the present invention, a component, referred to herein as a gold pad array (GPA), is provided to more conveniently, efficiently and cost-effectively provide for the application of a highly electrically conductive material, such as gold, onto a plurality of pads disposed on a board, such as a printed circuit board.

Figure 1:
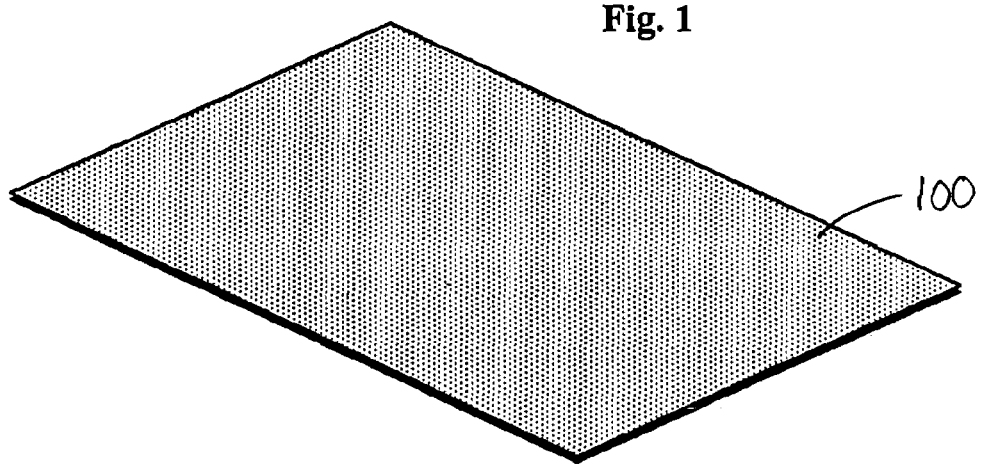
FIG. 1 illustrates a gold pad structure with solder on the bottom thereof in accordance with the present invention.

FIG. 1 illustrates a gold pad structure 100 in accordance with the present invention, that has gold on a first surface and solder on an opposing surface thereof. It is noted that although gold is a presently preferred material, the present invention is not limited to the use of gold, and that any material with the desired electrical, chemical, and/or physical properties may be used in conjunction with the present invention.

Figure 2:
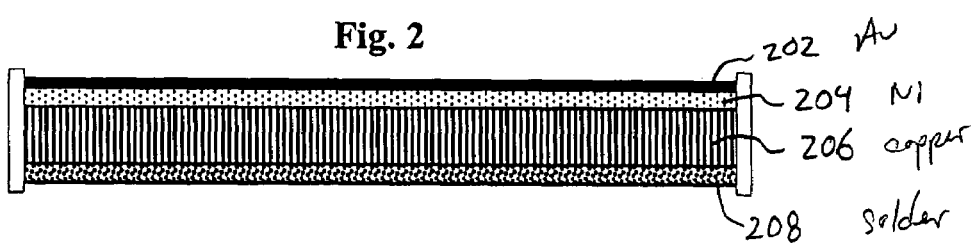
FIG. 2 is a cross-sectional view of a gold pad in accordance with the present invention, illustrating various layers of conductive material of the structure including a gold layer, a nickel layer subjacent the gold layer, a copper layer subjacent the nickel layer, and a solder layer subjacent the copper layer.

FIG. 2 is a cross-sectional view of gold pad structure 100, illustrating various layers of conductive material of the structure including a gold layer, a nickel layer subjacent the gold layer, a copper layer subjacent the nickel layer, and a solder layer subjacent the copper layer.

Figure 3:
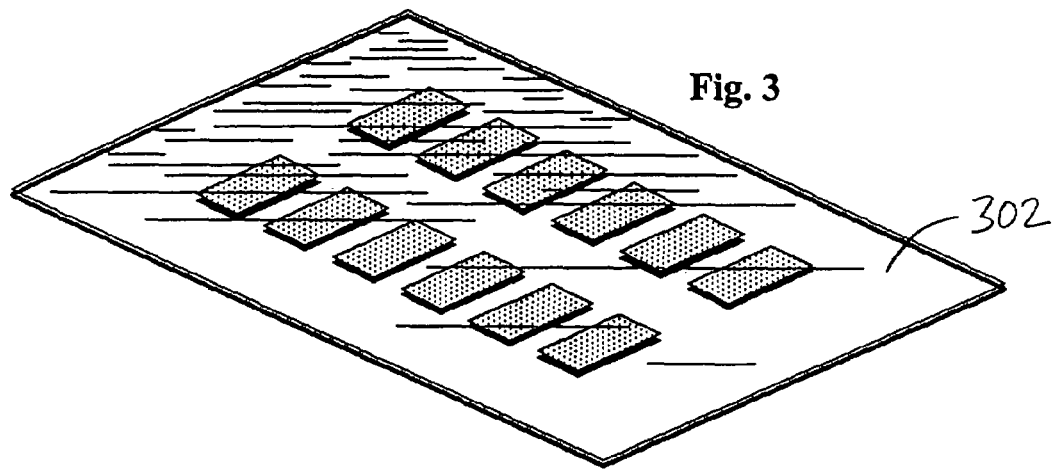
FIG. 3 illustrates a water soluble tape with a plurality of patterned gold pad structures disposed thereon, such that the solder layer is exposed and the gold layer is in contact with the water soluble tape.

FIG. 3 illustrates a water soluble tape 302 with a plurality of patterned gold pad structures 100 disposed thereon, such that the solder layer is exposed and the gold layer is in contact with the water soluble tape. In one embodiment of the present invention, the metal stack structure shown in FIG. 2 is formed on a tape backing and patterned to form individual gold pad structures 100. As illustrated in FIG. 3, the gold layer is adjacent the water soluble tape and the solder layer is exposed. This gold pad structure/soluble tape combination is used in accordance with methods of the present invention to provide gold-plated pads on circuit boards.

Figure 4:
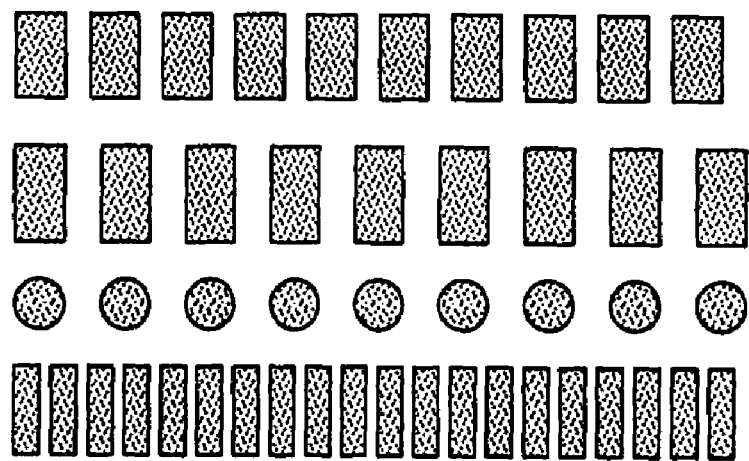
FIG. 4 is a top view of a patterned layer of gold pad structures illustrating that the gold pad structures may have a wide variety of shapes and sizes.

FIG. 4 is a top view of a patterned layer of gold pad structures 100 illustrating that gold pad structures 100 may have a wide variety of shapes and sizes. The present invention is not limited to any particular shape or size of gold pad structures 100.

Figure 5:
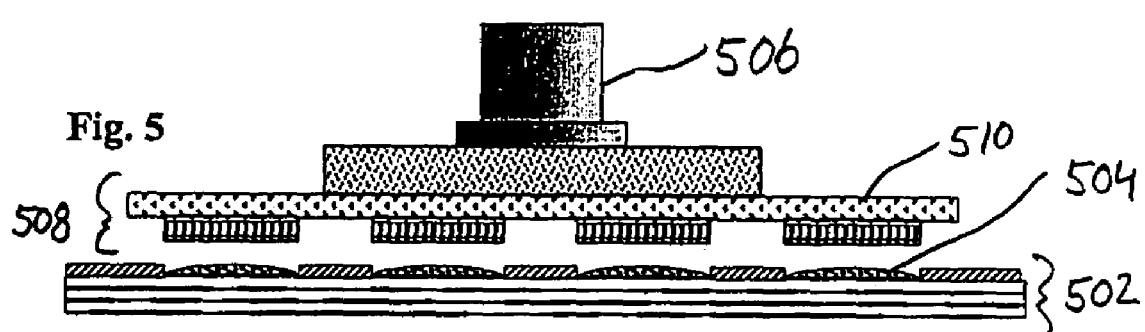
FIG. 5 is a side view of an illustrative multi-layer printed circuit board with solder paste disposed on a plurality of pads; and a pick and place mechanism holding a gold pad structure/soluble tape combination aligned above the printed circuit board for placement thereon.

FIG. 5 is a side view of an illustrative multi-layer printed circuit board 502 with solder paste 504 disposed on a plurality of pads; and a pick and place mechanism 506 holding a gold pad structure/soluble tape combination 508 aligned above the printed circuit board for placement thereon. The soluble tape 510 is preferably soluble in a solvent such as water, but the present invention is not limited to any particular solvent.

Figure 6:
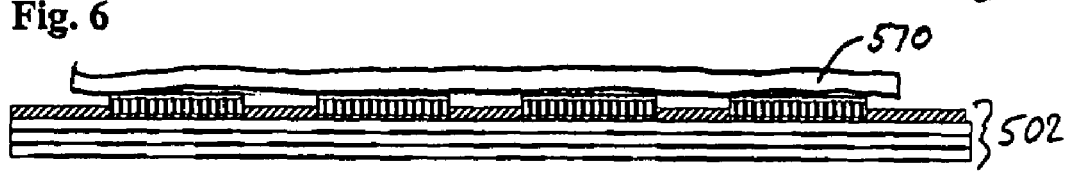
FIG. 6 shows the structure of FIG. 5 after the gold pad structure/soluble tape combination has undergone a solder reflow operation.

FIG. 6 shows the structure of FIG. 5 after the gold pad structure/soluble tape combination has undergone a solder reflow operation. The solder reflow operation serves to attach the gold pad structure/soluble tape combination to the underlying circuit board. The soluble tape backing provides mechanical support of the gold pad structures 100 until the solder reflow operation attaches the gold pad structures 100 to the circuit board.

Figure 7:
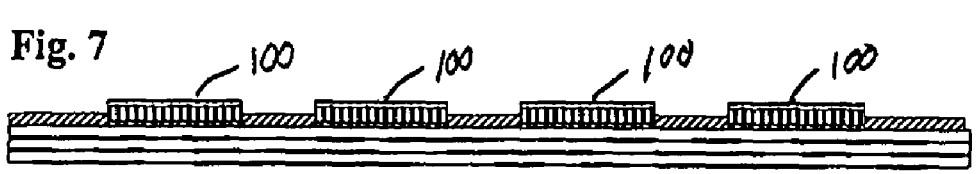
FIG. 7 shows the structure of FIG. 6 after the soluble tape has been dissolved in a wash cycle.
Figure 8:
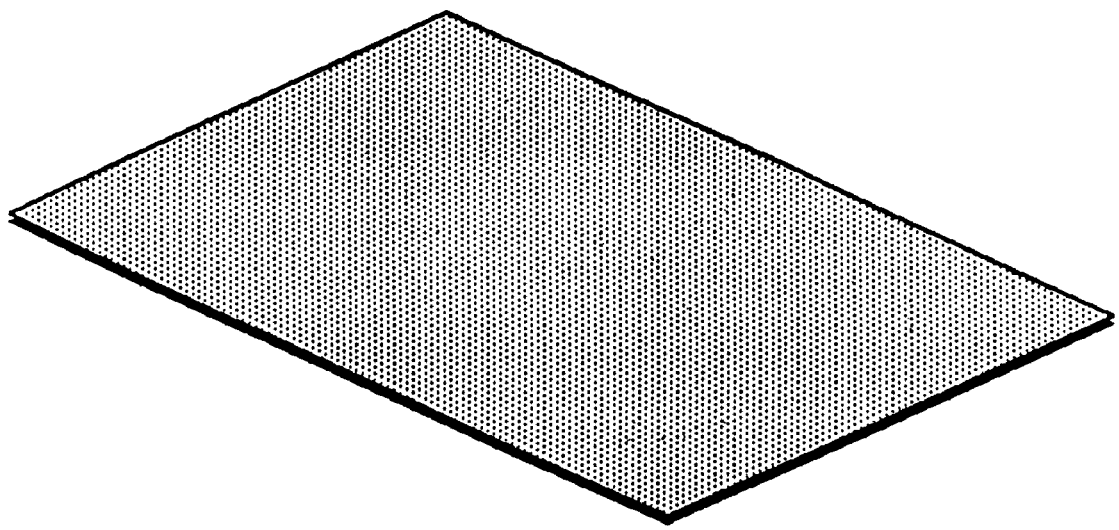
FIG. 8 shows a top view of an unpatterned stack of materials having gold as the top layer.

FIG. 7 shows the structure of FIG. 6 after the soluble tape has been dissolved in a wash cycle. It can be seen that after the tape has been dissolved, the gold surface of gold pad structures 100 are present on the surface of the selected portions of the circuit board where the pick and place operation had disposed the gold pad structure/soluble tape combination FIG. 8 shows a top view of an unpatterned stack of materials having gold as the top layer. In this illustrative embodiment, the stack has a top layer of gold, a nickel layer subjacent the gold layer, a copper layer subjacent the nickel layer and a solder layer subjacent the copper layer. It is noted that various embodiments of the present invention may use any suitable alternative material stacks.

Figure 9:
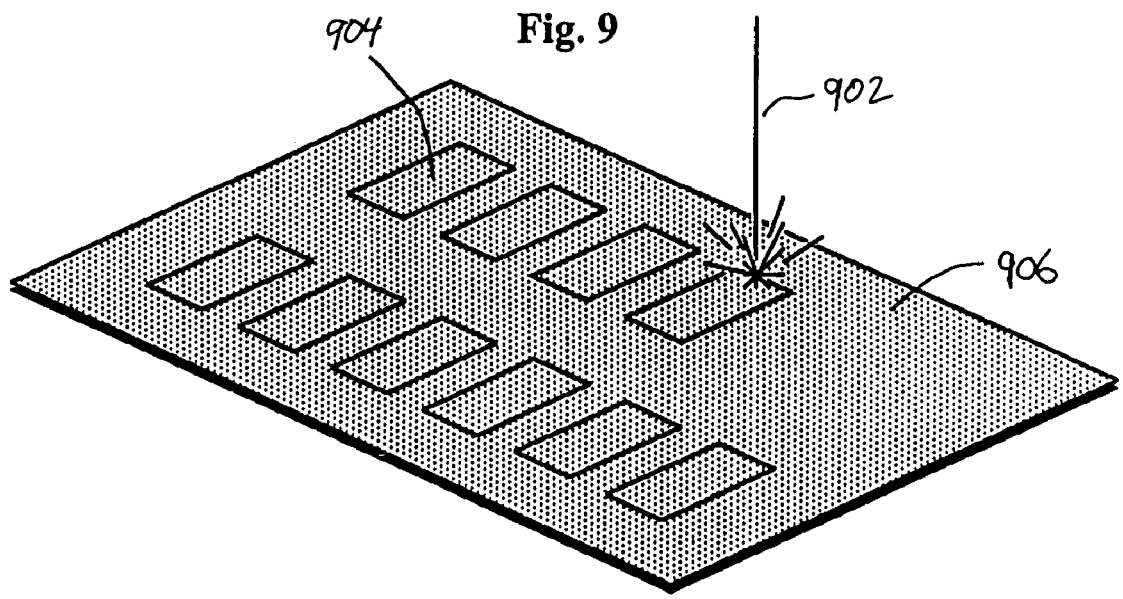
FIG. 9 shows the structure of FIG. 8 after both "field", and "gold pad" structures (i.e., padstacks) have been defined by way of a laser cutting, or etching, operation.

FIG. 9 shows the structure of FIG. 8 after both field 906 and gold pad structures 904 (i.e., padstacks) have been defined, or patterned, by way of a laser cutting 902, or etching, operation. In typical embodiments of the present invention, lasers in the near infra-red, green, or ultraviolet wavelengths may be used. Patterning may alternatively be accomplished by means of, for example, a water-jet with abrasive content; laser energy delivered with a water-jet; a saw; a die cutter; an ion beam (not typically used for other than very small patterns); or an air driven abrasive stream.

With respect to the patterning operations described above, it is noted that laser etching may be performed from either the top side (i.e., gold-side in this example) or from the bottom side (i.e., the solder-side in this example).

Figure 10:
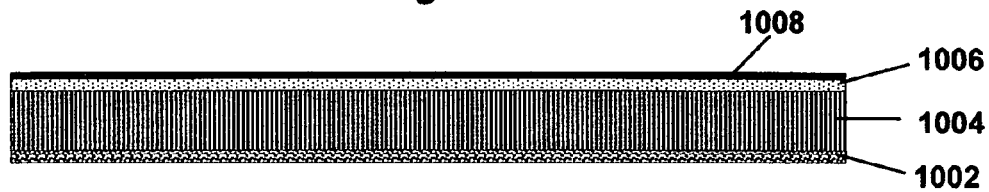
FIG. 10 is a cross-sectional view of an unpatterned stack of materials similar to that shown in FIG. 2, except the attachment layer is indicated to be comprised of either flux, solder paste, or conductive ink.

FIG. 10 is a cross-sectional view of an unpatterned stack of materials 1002, 1004, 1006, 1008 similar to that shown in FIG. 2, except the attachment layer 1002 is comprised of either flux, solder paste, or conductive ink.

Figure 11:
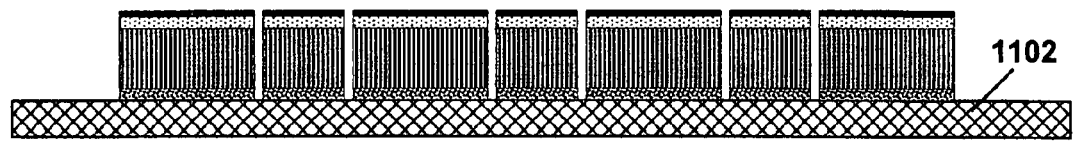
FIG. 11 is a cross-sectional view of the structure of FIG. 9, wherein the structure is disposed upon a fixture such as, for example, a vacuum hold down.
Figure 12:
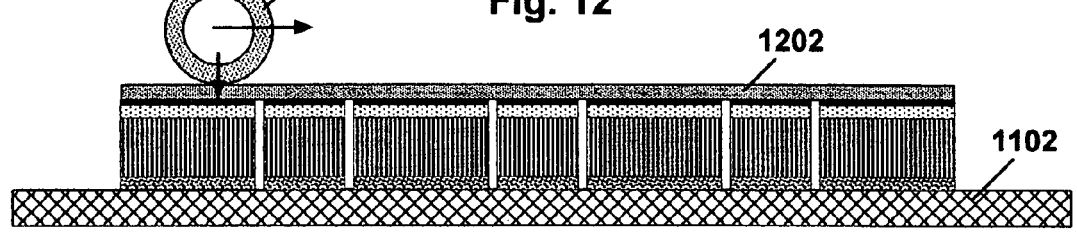
FIG. 12 is a cross-sectional view of the structure of FIG. 11, which also shows a water soluble tape being applied by a pressure roller.

FIG. 11 is a cross-sectional view of the structure of FIG. 9, wherein the structure is disposed upon a fixture 1102 such as, for example, a vacuum hold-down fixture. FIG. 12 is a cross-sectional view of the structure of FIG. 11, which also shows a water soluble tape 1202 being applied by a pressure roller 1204.

Referring to FIGS. 11-12, the unpatterned stack is placed solder-side down on a hold-down fixture, such as for example, a vacuum plate, or a vacuum chuck. The laser etching operation is then performed. A water soluble sticky tape is then applied to the surface of the patterned stack of materials, in this example by means of rollers. The padstacks are lifted away from the field portion of the material stack by the water soluble sticky tape It is noted that although a water soluble sticky tape is used in this example the invention is not limited to tapes that are water soluble.

Figure 13:
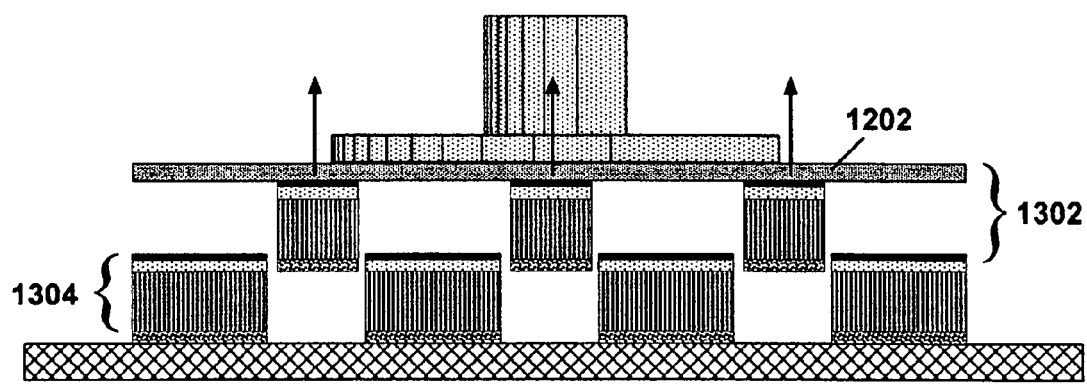
FIG. 13 is a cross-sectional view of a pick-and-place footprint for a gold pad structure in accordance with the present invention.

FIG. 13 is a cross-sectional view of a pick-and-place footprint 1302 for a gold pad structure in accordance with the present invention.

Figure 14:
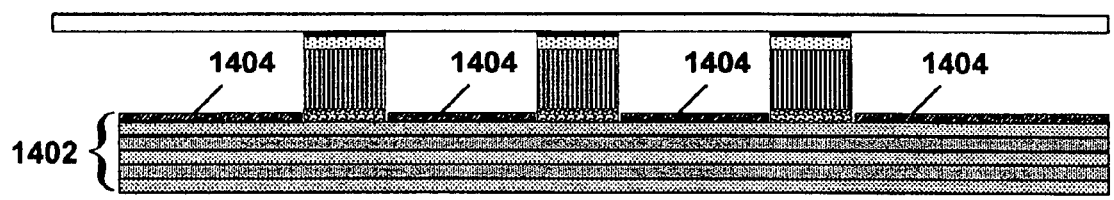
FIG. 14 is a cross-sectional view of the gold pad structure of FIG. 13, after that structure has been placed onto a substrate, such as, for example, a printed circuit board having a solder mask thereon.

FIG. 14 is a cross-sectional view of the gold pad structure of FIG. 13, after that structure has been placed onto a substrate 1402, such as, for example, a printed circuit board having a solder mask 1404 thereon.

Figure 15:
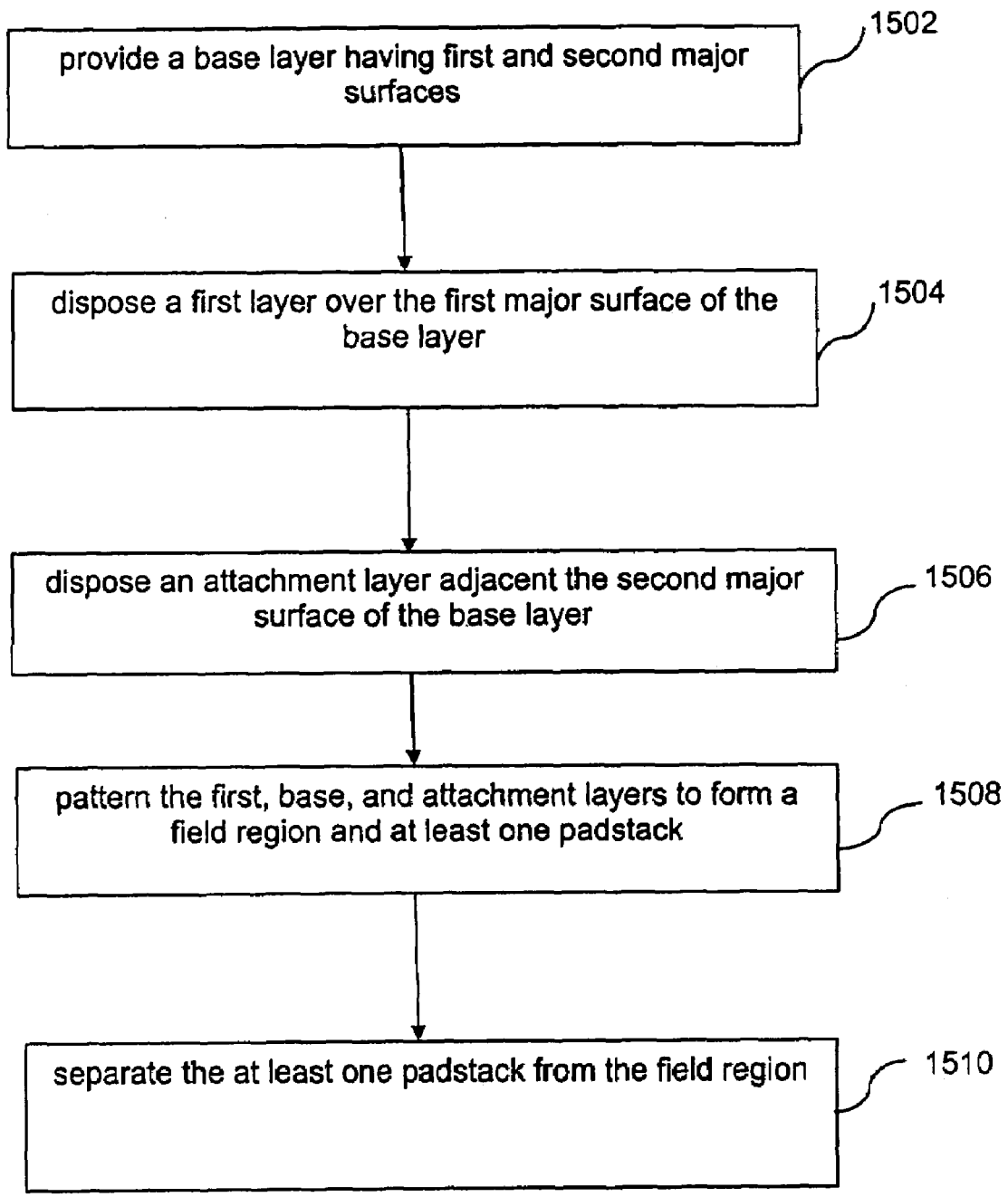
FIG. 15 is a flow diagram illustrating a method of making a structure in accordance with the present invention.

FIG. 15 is a flow diagram illustrating a method of making a structure in accordance with the present invention. In this illustrative embodiment, a base layer having a first major surface and a second major surface is provided 1502. The base layer is typically a sheet of metal. In various embodiments a cleaning operation may be performed on the base layer to remove, for example, oxidation or other contaminants. A first layer of material is disposed 1504 over the first surface of the base layer. In various embodiments, there may be one or more intervening material layers disposed between the base layer and the first layer. An attachment layer is disposed 1506 adjacent the second major surface of the base layer. FIG. 15 further indicates that the illustrative embodiment includes patterning 1508 the first, base, and attachment layers to form a field region, and at least one padstack. The at least one padstack is separated 1510 from the field region, and may be used immediately thereafter, or may be stored for later use.

Figure 16:
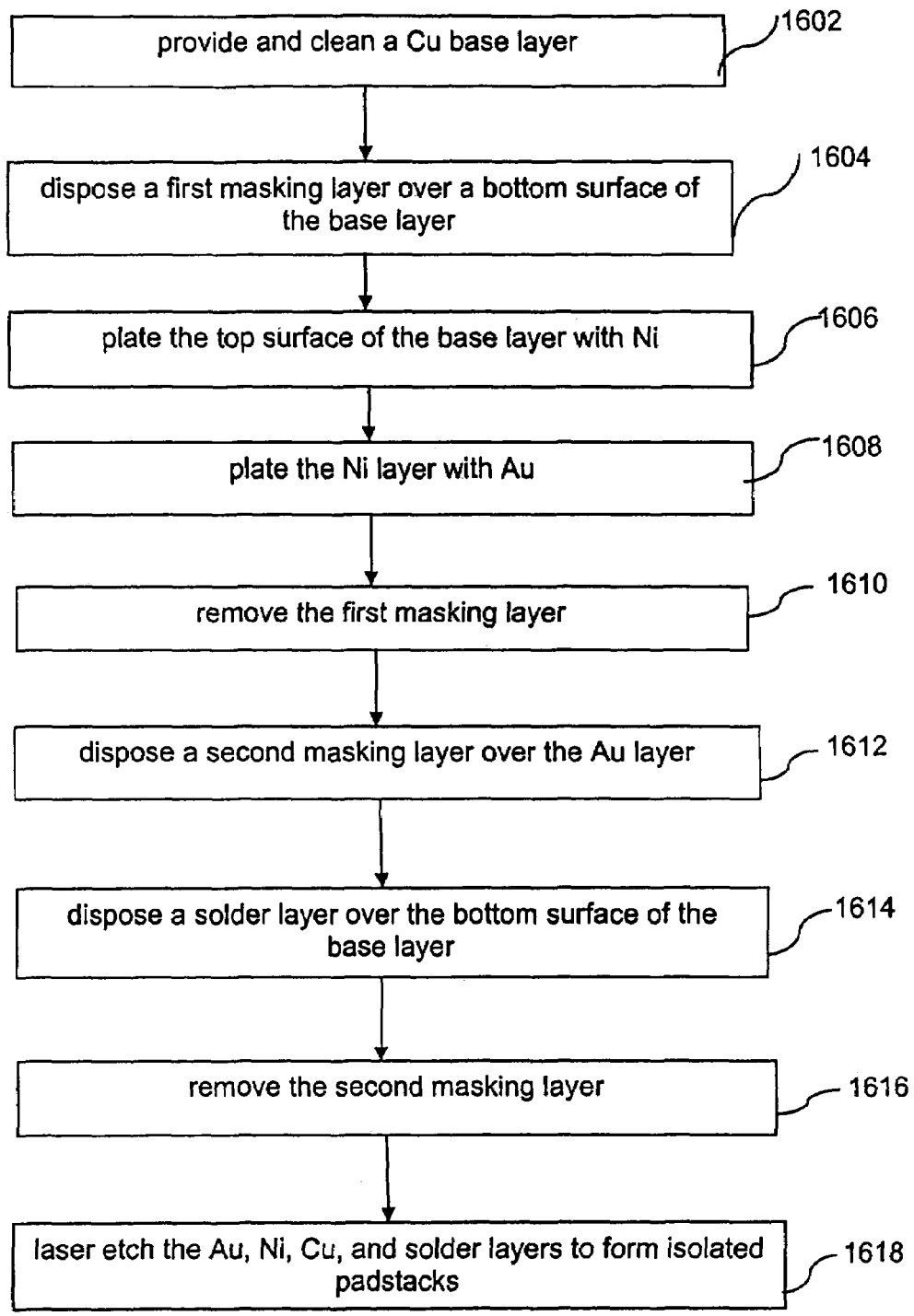
FIG. 16 is a flow diagram illustrating a method of making a structure in accordance with the present invention.

FIG. 16 is a flow diagram illustrating a method of making a padstack structure in accordance with the present invention. In this illustrative embodiment, a copper base layer is provided and cleaned 1602. A first masking layer is then disposed 1604 over a bottom surface of the base layer. It will be appreciated that references to "top" and "bottom" surfaces are for the convenience of description, and are not intended to be limitations on the particular spatial orientation of these illustrative structures. The top surface of the base layer, which is not masked, is then plated 1606 with nickel. The nickel layer is then plated 1608 with gold to form a gold layer. The first masking layer is then removed 1610. A second masking layer is disposed 1612 over the gold layer. A solder layer is disposed 1614 over the bottom surface of the base layer. The second masking layer is then removed 1616. The gold, nickel, copper and solder layers are then laser etched 1618 to form isolated padstacks.

In typical embodiments, a padstack provides an electrically conductive pathway between its top and bottom surfaces. It is noted that alternative padstacks may include one or more layers that are not electrically conductive, such that an electrical pathway does not exist between the top and bottom surfaces of the padstack.

Compliant Contact Arrays

In accordance with a further aspect of the present invention, a padstack is provided with at least one elastomer layer. These are similar to the above described conductive stacks, but are equipped with at least one deformable layer such that compliant contact may be made with a substrate. In such a configuration, each padstack provides electrical conductivity therethrough, and when used in an array of padstacks, compliant contact can be made with underlying contact terminals even if there is some non-planarity associated with those underlying contact terminals. It will be appreciated that in making contact between an array of compliant padstacks and the contact terminals of an underlying substrate, the elastomer layer will allow some padstacks to be compressed such that other padstacks may be brought closer to the contact terminals that have not yet been brought into contact.

Figures 17A, 17B:
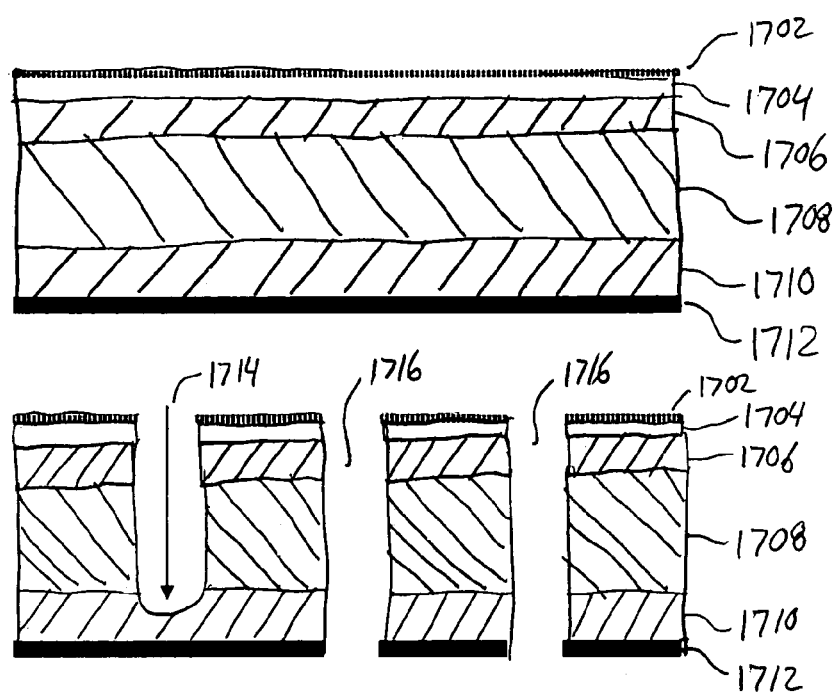
FIG. 17A is a cross-sectional view of a sheet having an attachment layer, a first conductive layer, an elastomer layer, a second conductive layer, a third conductive layer and a fourth conductive layer.
FIG. 17B is a cross-sectional view of the sheet of FIG. 17A, after a plurality of compliant padstacks have been formed by anisotropic etching, such as for example, laser etching.

Referring to FIGS. 17A and 17B, a sheet including a stack of materials that can be patterned into a compliant contact array is shown. More particularly, an attachment layer 1712 is shown with a first conductive layer 1710 disposed thereon. An elastomer layer 1708 is disposed over first conductive layer 1710, and a second conductive layer 1706 is disposed over conductive elastomer layer 1708. In the illustrative embodiment, a third and a fourth conductive layer 1704, 1702 are further disposed above the second conductive layer. Fourth conductive layer 1702 may be gold, third conductive layer 1704 may be nickel, second conductive layer 1706 may be brass, and first conductive layer 1710 may be brass. As can be seen in FIG. 17B, an anisotropic etch, such as by laser beam 1714 is used to form gaps 1716 and thereby separate individual compliant padstacks from the background field region.

In some embodiments, subsequent to the formation of the individual compliant padstacks, an electrically insulating barrier layer is formed on the vertical sidewalls of the individual compliant padstacks, These barrier layers may be formed so as to coat all of the padstack sidewalls, or only a portion of the sidewalls wherein at least the elastomer sidewall is coated. This electrically insulating coating of the conductive elastomer sidewall, acts to prevent electrical shorting between adjacent compliant padstacks when those elastomer layers are deformed such that they extend laterally outward.

Figure 18:
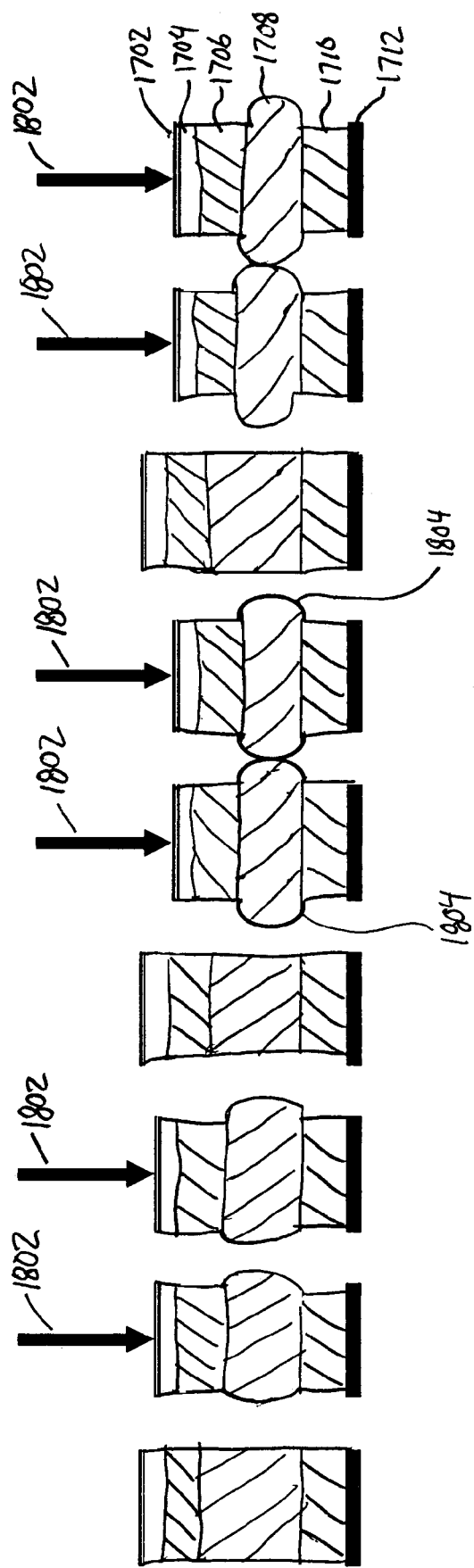
FIG. 18 is a cross-sectional view of a plurality of compliant padstacks, several of which are in various states of compression, and further showing a barrier layer to prevent shorting when the deformed elastomer layers are compressed to the extent that a lateral connection is formed.

Referring to FIG. 18, an array of compliant padstacks showing compressive forces 1802 being applied, and electrically insulating coatings 1804 that prevents electrical shorting when the conductive elastomer layers 1708 are laterally extended due to compressive forces 1802.

In one embodiment, a compliant contact array in accordance with the present invention includes, a plurality of padstacks adhered to a tape, each padstack including: an attachment layer; a first conductive layer disposed on the attachment layer; an elastomer layer disposed over the first conductive layer; a second conductive layer disposed over the elastomer layer; a third conductive layer disposed over the second conductive layer; and a fourth conductive layer disposed over the third conductive layer; wherein the tape is adapted to be removable from the padstacks. In various embodiments the elastomer layer is electrically conductive. The attachment layer may comprise materials such as, for example, solder, solder flux, or adhesive conductive ink. It is noted that the attachment layer is adapted to physically bond with a contact pad disposed on a substrate, and form an electrically conductive connection therewith. The substrate may be a printed circuit board, a chip package, an interposer, or similar substrate.

In some embodiments of the present invention, the first conductive layer and the second conductive layer of the compliant contact array are conductive materials such as copper or brass. In various experiments by the inventor, brass has been found to be better than copper in terms of adhesion to the elastomer layer. In some embodiments, the third conductive layer is formed from nickel, and the fourth conductive layer is formed from gold.

In an alternative embodiment, the elastomer layer is formed from a stack of materials that includes a first conductive elastomer layer, a second conductive elastomer layer, and a conductive adhesive disposed between the first and second conductive elastomer layers.

One illustrative method of forming a compliant contact array, includes forming a stack of unpatterned material layers, the stack comprising an attachment layer, a first conductive layer disposed on the attachment layer, an elastomer layer disposed over the first conductive layer, a second conductive layer disposed over the elastomer layer, a third conductive layer disposed over the second conductive layer, and a fourth conductive layer disposed over the third conductive layer; disposing a vacuum blocking mask on a vacuum hold down; disposing the stack of unpatterned material layers over the vacuum blocking mask; patterning the unpatterned material layers so as to form at least one padstack and a field region; and applying a tape over the at least one padstack. A predetermined vacuum force may be applied through the vacuum hold down. Some embodiments further include applying pressure to the tape. The tape is typically a soluble tape. In one embodiment, the tape is a polyvinyl alcohol with synthetic water soluble adhesive. Illustrative embodiments typically include moving the at least one padstack away from the vacuum hold down, and then using or storing the padstacks.

In some embodiments, forming the elastomer layer comprises disposing a first conductive elastomer over a conductive material selected from the group consisting of copper and brass; disposing a conductive adhesive on the first conductive elastomer, and disposing a second conductive elastomer on the conductive adhesive. In some embodiments, forming the elastomer layer includes forming the elastomer layer to have a hardness in a predetermined range.

In some embodiments, patterning includes exposing a portion of the stack of unpatterned material layers to laser energy, thereby removing material sufficient to form a gap between the at least one padstack and the field.

One illustrative method of selectively applying a conductive material coupled to a compliant layer, includes picking a compliant contact array; placing the compliant contact array on a substrate; forming a physical bond between an attachment layer of the compliant contact array and the substrate; and removing a tape layer from the compliant contact array; wherein picking and placing of the compliant contact array is accomplished by a pick-and-place apparatus. Picking includes making contact between the pick-and-place apparatus and the tape layer.

In various embodiments, forming a physical bond may comprise a solder reflow operation. Removing the tape layer may comprise applying at least one solvent to the tape layer. Applying at least one solvent to the tape layer may comprise washing the substrate, with at least water. It is noted that the tape layer is not removed by heat from the solder reflow operation.

In various embodiments of the present invention, the substrate may be a circuit board, a chip package (e.g., a land grid array), an interposer, or similar structures.

CONCLUSION

Various embodiments of the present invention include apparatus and methods for selectively applying a material to portions of a circuit board. More particularly, various embodiments of the present invention provide a structure suitable for use with existing pick-and-place equipment that can be placed on, and adhered to, a circuit board, or other substrate, and subsequently have an unneeded tape portion dissolved away.

Embodiments of the present invention may find application in the manufacture of in various electronic or opto-electronic products that include printed circuit boards, flex substrates, ceramic substrates, interposers, or similar substrates. It will be appreciated that such substrates are not required to have other active or passive electrical circuit elements disposed thereon, and that such substrates having padstacks, e.g., padstacks with at least one elastomer layer, disposed on them, may be used to provide mechanical and electrical contact between two devices, such as for example, a wafer and a tester.

An advantage of some embodiments of the present invention includes the cost-effective selective application of material, such as, for example, gold, to circuit boards or similar substrates.

Another advantage of some embodiments of the present invention includes the ability to use conventional pick-and-place tools to provide gold-plating for selective portions of circuit boards, or similar substrates.

A still further advantage of some embodiments of the present invention includes selectively disposing gold contact regions on a circuit board, or similar substrates, without exposing that circuit board, or similar substrates, to wet chemical processing.

It is to be understood that the present invention is not limited to the embodiments described above, but encompasses any and all embodiments within the scope of the subjoined Claims and their equivalents.

What is claimed is:

1. A compliant contact array, comprising:
   a plurality of padstacks adhered to a tape,
   each padstack comprising:
   an attachment layer;
   a first conductive layer disposed on the attachment layer;
   a conductive elastomer layer disposed over the first conductive layer;

a second conductive layer disposed over the elastomer layer;

a third conductive layer disposed over the second conductive layer; and a fourth conductive layer disposed over the third conductive layer;

wherein each padstack is adhered to the tape such that the fourth conductive layer is adjacent the tape, and the tape is adapted to be removable from the padstacks; and wherein the first conductive layer comprises copper, the second conductive layer comprises copper, the third conductive layer comprises nickel and the fourth conductive layer comprises gold.

2. The compliant contact array of claim 1, wherein the attachment layer comprises solder.

3. The compliant contact array of claim 1, wherein the attachment layer comprises solder flux.

4. The compliant contact array of claim 1, the attachment layer comprises adhesive conductive ink.

5. The compliant contact array of claim 1, the attachment layer is adapted to physically bond with a contact pad disposed on a substrate, and form an electrically conductive connection therewith.

6. The compliant contact array of claim 5, wherein the substrate comprises a printed circuit board.

7. The compliant contact array of claim 5, wherein the substrate comprises a chip package.

8. The compliant contact array of claim 1, wherein the first conductive layer comprises copper, the second conductive layer comprises copper, the third conductive layer comprises nickel, and the fourth conductive layer comprises gold.

9. The compliant contact array of claim 1, wherein the conductive elastomer layer comprises a first conductive elastomer layer, a second conductive elastomer layer, and a conductive adhesive disposed between the first and second conductive elastomer layers.

10. A compliant contact array, comprising:
a plurality of padstacks adhered to a tape,
each padstack comprising:
an attachment layer;
a first conductive layer disposed on the attachment layer;
a conductive elastomer layer disposed over the first conductive layer;
a second conductive layer disposed over the conductive elastomer layer;
a third conductive layer disposed over the second conductive layer; and
a fourth conductive layer disposed over the third conductive layer;

wherein each padstack is adhered to the tape such that the fourth conductive layer is adjacent the tape, and the tape is adapted to be removable from the padstacks;

and wherein the first conductive layer comprises a material selected from the group consisting of brass and copper, the second conductive layer comprises a material selected from the group consisting of brass and copper, the third conductive layer comprises nickel, and the fourth conductive layer comprises gold.

11. The compliant contact array of claim 10, wherein the conductive elastomer layer comprises a first conductive elastomer layer, a second conductive elastomer layer, and a conductive adhesive disposed between the first and second conductive elastomer layers.

12. The compliant contact array of claim 10, further comprising an electrically insulating coating covering at least a portion of a sidewall of each padstack.

13. The compliant contact array of claim 12, wherein the portion of the sidewall of each padstack covered by the electrically insulating coating includes the sidewall portion of the conductive elastomer layer.

14. The compliant contact array of claim 10, wherein the tape is water soluble.

* * * * *